US012677661B2

(12) United States Patent
Lechner et al.

(10) Patent No.: US 12,677,661 B2
(45) Date of Patent: Jul. 7, 2026

(54) METHOD FOR PRODUCING A COOLING ELEMENT, AND COOLING ELEMENT PRODUCED USING SUCH A METHOD

(71) Applicant: Rogers Germany GmbH, Eschenbach (DE)

(72) Inventors: Ralf Lechner, Creußen (DE); Thomas Rupp, Püchersreuth (DE)

(73) Assignee: ROGERS GERMANY GMBH, Eschenbach (DE)

( * ) Notice: Subject to any disclaimer, the term of this patent is extended or adjusted under 35 U.S.C. 154(b) by 592 days.

(21) Appl. No.: 17/616,047

(22) PCT Filed: Jan. 25, 2021

(86) PCT No.: PCT/EP2021/051578
§ 371 (c)(1),
(2) Date: Jul. 28, 2022

(87) PCT Pub. No.: WO2021/164987
PCT Pub. Date: Aug. 26, 2021

(65) Prior Publication Data
US 2022/0415754 A1 Dec. 29, 2022

(30) Foreign Application Priority Data

Feb. 20, 2020 (DE) ..................... 10 2020 104 493.3

(51) Int. Cl.
*H01S 5/024* (2006.01)
*H10W 40/00* (2026.01)
(Continued)

(52) U.S. Cl.
CPC ......... *H10W 40/47* (2026.01); *H01S 5/02423* (2013.01); *H10W 40/037* (2026.01); *H10W 40/255* (2026.01); *H10W 40/258* (2026.01)

(58) Field of Classification Search
CPC ................................ H01L 23/04; H01L 23/03
See application file for complete search history.

(56) References Cited

U.S. PATENT DOCUMENTS 4,685,606 A * 8/1987 Flint ..................... H01L 23/473
228/123.1
6,768,193 B2 * 7/2004 Nakamura .......... H01L 23/3731
257/E23.113
(Continued)

FOREIGN PATENT DOCUMENTS

CN 110026633 A 7/2019
DE 4315580 A1 11/1994
(Continued)

OTHER PUBLICATIONS

International Preliminary Report on Patentability for International Application No. PCT/EP2021/051578, International Filing Date Jan. 25, 2021, Date of Mailing Aug. 23, 2022, 8 pages.

*Primary Examiner* — Jeff W Natalini
*Assistant Examiner* — Andrew John Zabel
(74) *Attorney, Agent, or Firm* — CANTOR COLBURN LLP

(57) ABSTRACT

A method of manufacturing a cooling element, including:
providing at least one first metal layer and at least one second metal layer,
oxidizing the at least one first metal layer and/or the at least one second metal layer,
structuring the at least one first metal layer and/or the at least one second metal layer to form at least one recess,
joining the at least one first metal layer and the at least one second metal layer to form the cooling element, wherein, in the joined state, at least a partial section of a cooling channel in the cooling element is formed by the recess in the at least one first metal layer and/or the at least one second metal layer, and wherein, (Continued)

prior to the joining, an inner side of the recess is provided at least in sections free of an oxidized surface.

18 Claims, 5 Drawing Sheets

(51) Int. Cl.
H10W 40/25 (2026.01)
H10W 40/47 (2026.01)

(56) References Cited

U.S. PATENT DOCUMENTS

| | | | |
|---|---|---|---|
| 7,299,967 B2 | 11/2007 | Schulz-Harder | |
| 8,056,230 B2 | 11/2011 | Schulz-Harder | |
| 8,327,540 B2 * | 12/2012 | Michel | H01L 23/42 |
| | | | 165/185 |
| 2009/0071257 A1 | 3/2009 | Neagle et al. | |

| | | | |
|---|---|---|---|
| 2010/0187560 A1 * | 7/2010 | Traupe | H10H 20/8582 |
| | | | 228/208 |
| 2011/0026551 A1 | 2/2011 | Stephens et al. | |
| 2012/0291995 A1 | 11/2012 | Sasaki et al. | |
| 2013/0221396 A1 | 8/2013 | Traupe et al. | |
| 2018/0301391 A1 * | 10/2018 | Oohiraki | H01L 25/072 |
| 2020/0361828 A1 * | 11/2020 | Engel | B32B 9/041 |
| 2022/0087051 A1 * | 3/2022 | Muneishi | H01L 23/473 |
| 2022/0310912 A1 * | 9/2022 | Bruce | H10N 70/8828 |

FOREIGN PATENT DOCUMENTS

| | | | | |
|---|---|---|---|---|
| DE | 19820355 A1 | | 10/1998 | |
| DE | 19956565 A1 * | | 5/2001 | ........ H01L 21/4882 |
| DE | 102004002841 * | | 5/2005 | .......... B23K 1/0012 |
| DE | 102004002841 B3 | | 5/2005 | |
| JP | 2005223319 A | | 8/2005 | |
| JP | 2007522942 | | 8/2007 | |
| JP | 2008300596 A | | 12/2008 | |
| JP | 2009124186 * | | 6/2009 | ........... H01L 23/36 |
| JP | 2009124186 A | | 6/2009 | |

* cited by examiner

METHOD FOR PRODUCING A COOLING ELEMENT, AND COOLING ELEMENT PRODUCED USING SUCH A METHOD

CROSS REFERENCE TO RELATED APPLICATIONS

This application is a National Stage application of PCT/EP2021/051578, filed Jan. 25, 2021, which claims the benefit of European Patent Application No. 10 2020 104 493.3, filed Feb. 20, 2020, both of which are incorporated by reference in their entirety herein.

BACKGROUND

The present invention relates to a method of manufacturing a cooling element and to a cooling element manufactured by such a method.

Cooling elements for cooling electrical or electronic components, in particular semiconductors such as laser diodes, are well known from the prior art. The electrical or electronic components generate heat during their operation, which is to be dissipated by means of the cooling element in order to ensure the permanent functionality of the electrical or electronic components. This applies in particular to laser diodes, where temperature differences of only a few ° C. can already lead to significant impairments in performance and/or service life.

For cooling the components, the cooling elements, which are usually attached to the components, typically have a cooling channel through which a cooling fluid is passed during operation in order to absorb and dissipate heat emanating from the electrical or electronic component. Preferably, a fin structure is used in which a plurality of web-like elements extend into the cooling channel to provide the largest possible contact area with the cooling fluid, thereby improving heat transfer from the walls, bounding the cooling channel, to the cooling fluid.

Accordingly, it is desirable to combine as many of these web-like elements as possible in the smallest possible space in order to ensure optimum cooling performance at the transition between the fin structure and the fluid. This finely structured shape of the web-like elements makes them difficult to handle in the manufacturing process.

DE 10 2004 002 841 B3 discloses a method for manufacturing cooling elements, in which a cooling element is manufactured by oxidizing the individual metal layers following structuring. The recesses produced by the structuring then form at least a partial section of a cooling channel in the manufactured cooling element, which is formed by stacking the metal layers and subsequently connecting the stacked metal layers.

From this, it is the object of the present invention to improve the manufacture of the cooling elements and the cooling elements, particularly when comparatively narrow cooling channels are provided in the cooling element.

This object is solved by a method and a cooling element as described herein. Further advantages and features of the invention result from the claims and subclaims as well as the description and the accompanying figures.

SUMMARY

According to a first aspect of the present invention, there is provided a method of manufacturing a cooling element, in particular a microcooling element, comprising:

providing at least one first metal layer and at least one second metal layer, oxidizing the at least one first metal layer and/or the at least one second metal layer, structuring the at least one first metal layer and/or the at least one second metal layer to form at least one recess, joining the at least one first metal layer and the at least one second metal layer to form the cooling element, in particular by bonding, for example by heating, wherein in a joined state at least a partial section of a cooling channel in the cooling element is formed by the recess in the at least one first metal layer and/or the at least one second metal layer, wherein prior to joining, an inner side of the recess is provided at least in sections, preferably completely, freed from an oxidized surface or an inner side of the recess freed from an oxidized surface is made available for joining or a joining process.

BRIEF DESCRIPTION OF THE FIGURES

Further advantages and features result from the following description of embodiments with reference to the attached figures. Individual features of the individual embodiment can thereby be combined with each other within the scope of the invention, which show, in.

DETAILED DESCRIPTION

Figure 1:
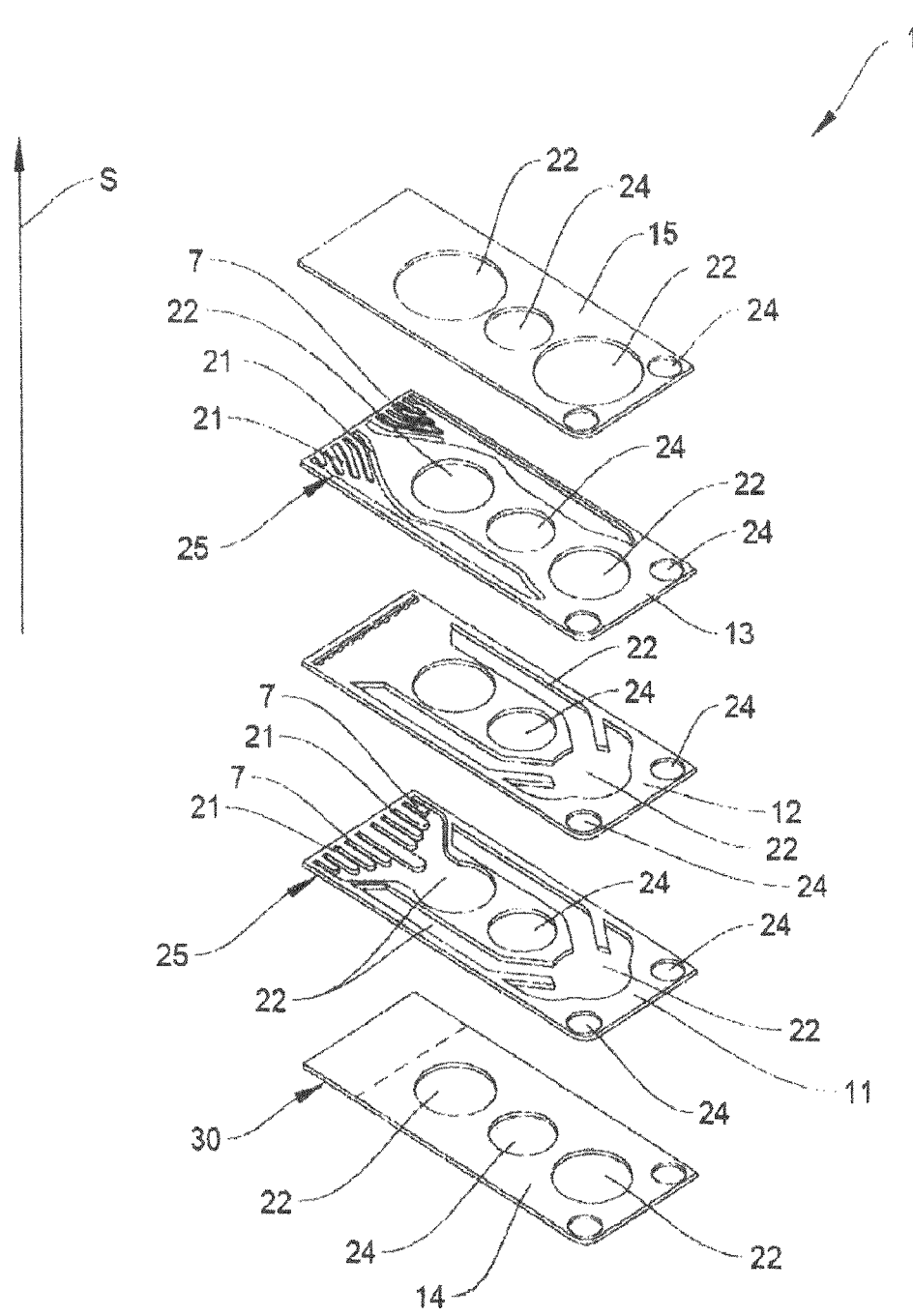
FIG. 1: schematic exploded view of a cooling element according to a first exemplary embodiment of the present invention.

In contrast to the prior art, it is envisaged to deliberately dispense with an oxidized surface on the inside of the recesses, whereby it is advantageously possible to prevent a melt from being formed in the joining process or during the joining, in which the at least one first metal layer is bonded to the at least one second metal layer, which melt could enter the region of the recess or the subsequently manufactured cooling channel and thus reduce an expansion of the cooling channel in the region of the recess or even lead to a blockage of the cooling channel in this subsection of the cooling channel. This has a decisive advantage in particular for cooling elements with comparatively thin or narrow cooling channels, in particular in the case of microchannel coolers, since a risk of clogging of the cooling channels can thus be prevented or reduced during manufacture. It is conceivable in this context that an oxidized surface is removed after oxidation, for example by a further etching step carried out following oxidation, in particular if the structuring was carried out before oxidation. It is also conceivable that the oxidized surface is removed mechanically, for example by a polishing or machining operation.

Preferably, the oxidizing is performed temporally prior to the structuring. The structuring, i.e. in particular the forming of the at least one recess, temporally after the oxidizing ensures that the produced recess does not have an oxidized surface on its inner side, since the inner side no longer undergoes oxidation after the structuring and is formed only after the oxidizing. In contrast to the prior art, it is in particular provided that the oxidizing is carried out before the structuring, whereas it is customary in the formation of cooling elements in the prior art to first carry out the structuring and then the oxidizing, which is necessary in order to create the necessary condition for the desired bond between the at least one first metal layer and the at least one second metal layer in the context of an intended bonding process, in particular by bonding. By changing the sequence, it is prevented in particular that, for example, etching flanks of the recess formed in the course of structuring are provided with an oxidized surface by subsequent oxidizing.

By changing the time sequence, it is also advantageously possible not to have to perform the oxidizing manually. This is in fact necessary if the structuring is carried out before the oxidizing and leads to finely structured individual components and/or to a finely structured at least one first metal layer and/or at least one second metal layer which, in the context of automated handling, runs the risk of being damaged. Accordingly, with the modified sequence it is in particular possible to perform an automation, in particular for oxidizing the at least one first metal layer and/or at least one second metal layer. It is even conceivable that the at least one first metal layer and/or the at least one second metal layer are handled with a gripping element, in particular with a gripping element using an underpressure or a vacuum, during the oxidizing or immediately before or after the oxidizing. Furthermore, the likelihood for an insufficient joining due to a defective oxidizing between the at least one first metal layer and the at least one second metal layer can be reduced, thereby reducing the number of defectively manufactured cooling elements.

In particular, the cooling element is a microchannel cooling element having a terminal area to which an electrical component, in particular a laser diode, can be mounted. Preferably, it is further provided that the method further comprises stacking the at least one first metal layer and the at least one second metal layer along a stacking direction forming the at least one portion of the cooling fluid channel. In particular, it is envisaged that the at least one first metal layer and/or the at least one second metal layer extend along a main extension plane and are stacked on top of each other along a stacking direction perpendicular to the main extension plane. The recesses may thereby have a square, circular, rectangular and/or elliptical cross-section. Further, it is thereby provided that the fabricated cooling channel comprises subsections extending parallel, oblique or perpendicular to the main extension plane or stacking direction. For example, the at least one first metal layer, the at least one second metal layer and/or the at least one third metal layer is made of copper. In this regard, the at least one first metal layer, the at least one second metal layer and/or the at least one third metal layer may correspond to or differ from each other with respect to their choice of material, for example with respect to the type of metal, an amount of impurities and/or a starting grain size.

Preferably, the cooling element comprises at least one third metal layer which also extends along a main extension plane and is arranged stacked in a direction perpendicular to the stacking direction together with the at least one first metal layer and the at least one second metal layer. In this regard, it is particularly provided that the at least one first metal layer, the at least one second metal layer and the at least one third metal layer differ from each other with respect to the position and shape of their recesses. In particular, it is provided that the at least one first metal layer, the at least one second metal layer and/or the at least one third metal layer arranged one above the other in the stacked state form the cooling channel through which the cooling fluid can be conducted during operation in order to conduct the heat away from the connection surface.

Furthermore, the cooling channel comprises in particular a supply region and a discharge region extending, for example, through the at least one first metal layer, the at least one second metal layer and/or the at least one third metal layer, the cooling channel preferably being configured such that, when the cooling fluid is transferred from the supply region to the discharge region, the cooling fluid has to pass through the part of the recess created by the patterning. Preferably, the cooling fluid passes through the fin structure as it passes from the supply region to the discharge region. In particular, it is provided that the cooling fluid passes through the cooling channel along the stacking direction, in particular passes through the fin structure along the stacking direction.

Furthermore, the cooling channel is configured such that the fluid conducted through the cooling channel is conducted from the at least one first metal layer via the at least one second metal layer into the at least one third metal layer, whereupon the fluid is deflected in the at least one third metal layer and is conducted back into the at least one second metal layer and/or the at least one first metal layer. Here, the cooling fluid again has access to the discharge region of the cooling channel and can be discharged from the cooling channel accordingly. Alternatively, it is conceivable that the first metal layer and/or the second metal layer form a fin structure in which fins project into a fluid channel past which the cooling fluid is guided along a single flow direction. In principle, a wide variety of designs of cooling channels are conceivable in which the web-like elements are produced by means of erosion, laser and/or etching.

Furthermore, it is preferably provided that the at least one first metal layer is joined to the at least one second metal layer, preferably by bonding. In particular, it is provided that the at least one first metal layer is joined to the at least one second metal layer, more preferably to the at least one third metal layer or further metal layers, without the use of an adhesion means or a classical metallic soldering material. For example, they are joined together by appropriate heating and possibly under pressure in such a way that a monolithic base body for the cooling element is formed.

Preferably, it is provided that for structuring, the at least one first metal layer and/or the at least one second metal layer are etched, lasered, laser-assisted and/or eroded. Particularly fine structuring and recesses can be realized in the at least one first metal layer, in the at least one second metal layer and/or in the at least one third metal layer, in particular by eroding. In this case, the sequence in which the oxidizing is carried out temporally prior to the structuring proves to be advantageous, because a downstream oxidizing, in particular manual oxidizing, can thereby be dispensed with. Structuring by means of etching proves to be advantageous in particular because it leads to structuring simply, quickly and reliably. In addition, in the case of oxidation preceding the structuring, etching flanks are prevented from forming which would be coated with an oxidized surface after oxidation.

In particular, it is provided that prior to joining, a region of an upper side and/or a lower side of the at least one first metal layer and/or the at least one second metal layer adjacent to the recess is provided freed from an oxidized surface. For example, in this case a part of the oxidized surface on the upper side and/or on the lower side of the at least one first metal layer and/or of the at least one second metal layer is etched away or removed again mechanically, by polishing. As a result, this region adjacent to the recess does not form a melt during bonding, which could possibly enter the recesses and clog the cooling channel that is later manufactured. For example, the region adjacent to the recesses extends or measures up to 3 mm, preferably up to 2 mm and particularly preferably up to 1 mm from the edge of the recess on the upper side and/or lower side in a direction parallel to the main extension plane.

Preferably, it is provided that in addition to the recess or recess in the at least one first metal layer and/or the at least one second metal layer, an area of reduced thickness is realized. In the region of reduced thickness, a further section of the cooling channel extending substantially parallel to the main extension plane can be formed, since this region also does not form a melt during bonding, which allows joining between the at least one first metal layer and/or the at least one second metal layer. After joining the at least one first metal layer and the at least one second metal layer, a respective hollow region is formed between the at least one first metal layer and the at least one second metal layer in the region having the reduced thickness. For example, in the planned reduced thickness region, the at least one first metal layer and/or the at least one second metal layer are partially etched or etched only from one side, i.e., only on a top side or a bottom side, whereas for forming the recess, the at least one first metal layer and/or the at least one second metal layer are partially etched or etched on both sides, i.e., on the top side and the bottom side. In other words, the maskings for the upper side and the lower side coincide in the regions for forming the recess, while in the region of the planned reduced thickness one of the upper-side and lower-side maskings is closed. Further, it is also conceivable that the reduced thickness region is spaced from the recess to form, for example, a subsection of the cooling channel substantially parallel to the main extension plane, the perpendicular extension of the cooling channel to the main extension plane being determined by the amount by which the reduced thickness region is reduced with respect to the thickness of the at least one first metal layer, the at least one second metal layer and/or the at least one third metal layer.

For example, a ratio of the reduced thickness to the thickness of the at least one first or second metal layer assumes a value between 0.25 and 0.8, preferably between 0.3 and 0.7, and particularly preferably between 0.4 and 0.6.

Furthermore, it is preferably provided that the oxidation is carried out thermally and/or chemically, in particular wet-chemically. Preferably, the oxidizing is carried out thermally, since this is advantageous for the subsequent lamination and facilitates this. For example, for this purpose the at least one first metal layer and/or the at least one second metal layer are conveyed through a corresponding installation, in particular horizontally. In this case, the procedure in which the oxidizing is carried out before the structuring is carried out proves to be particularly advantageous, because this permits simplified handling during the oxidizing, which simplifies the manufacturing process of the cooling element. Preferably, oxidizing can be performed on one side or on both sides.

Preferably, the manufactured cooling element has an upper covering layer and/or a lower covering layer, the at least one first metal layer and/or the at least one second metal layer and/or at least one third metal layer being arranged below the upper covering layer and/or above the lower covering layer, as viewed in the stacking direction, the upper covering layer and/or the lower covering layer having a connection region for connecting a component to be cooled, in particular a laser diode. In this context, it is conceivable, for example, that the upper and/or lower covering layer is made of a ceramic or a ceramic element. This proves to be particularly advantageous for those applications in which electrical insulation to the cooling element is required. For this purpose, a direct bonding process, such as a DCB process, or an active soldering process is preferably used.

Preferably, it is provided that the recess has an extension, in particular a width, of up to 0.8 mm, preferably up to 0.5 mm and particularly preferably up to 0.4 mm, in a direction parallel to a main extension plane. For such comparatively narrow expansions, the described procedure proves to be particularly advantageous, since at the corresponding expansions, in particular at those up to 0.4 mm, there is an increased risk of possible clogging by the melt, formed during joining. Nevertheless, the described approach reduces the likelihood that the melt may enter the recess and clog the subsequent section of the cooling channel in the manufactured state of the cooling element. By width, the skilled person preferably understands, particularly in the case of rectangular recesses, the direction perpendicular to the longitudinal direction of the recess and preferably forming the narrower side of the recess.

In a further embodiment, it is provided that a bonding, in particular heating, for joining the at least one first metal layer to the at least one second metal layer is carried out at a temperature between 500° C. and 1080° C., in particular between 850° C. and between 1080° C. or 500° C. and 660° C. As a result of the indicated temperatures during the bonding, a melt is formed in the regions with oxidized surface, which leads to the bonding of the at least one first metal layer and/or of the at least one second metal layer, forming a monolithic or one-piece cooling element. In particular, the bonding corresponds to a direct metal bonding process, for example a DCB or DAB process.

According to a preferred embodiment of the present invention, it is provided that the at least one first metal layer has a thickness dimensioned in the stacking direction of between 100 μm and 1 mm, preferably between 150 μm and 550 μm and more preferably between 150 μm and 350 μm. In this regard, the at least one first metal layer and/or the at least one second metal layer extends along a main extension plane and is for example made of copper. It is also conceivable that the at least one first metal layer differs from the at least one second metal layer, for example with regard to initial grain size, proportion of foreign substances or material, for example a layer of copper and a further layer of a copper alloy.

A further object of the present invention is a cooling element produced by a process according to the invention. All the properties and advantages described for the process can be transferred analogously to the cooling element and vice versa.

Further advantages and features will be apparent from the following description of preferred embodiments of the subject matter of the invention with reference to the accompanying figures.

FIG. 1 schematically shows an exploded view of a cooling element 1 according to a first preferred embodiment of the present invention. In particular, the cooling element 1 is one which is provided for cooling an electronic or electrical component (not shown), in particular a semiconductor element and particularly preferably a laser diode. For cooling the electrical or electronic component, the manufactured cooling element 1 forms a cooling channel through which a cooling fluid can be passed during operation, so that the cooling fluid can absorb and carry away heat emanating from the electronic or electrical component during operation.

For this purpose, a supply region and a discharge region are preferably provided in the cooling element 1, in particular in the cooling channel (not shown), the cooling fluid being introduced via the supply region and being discharged again via the discharge region. Preferably, it is provided that the cooling channel is configured in such a way that the cooling fluid 1 passes, at the transition from the supply region to the discharge region, a fin structure 25 which in particular projects into or forms the cooling channel. The fin structure 25 is preferably a web-like element 7 which projects into the cooling channel in order to provide the largest possible contact surface for the fluid, so that an effective transfer of heat from the web-like element 7 or the wall of the cooling channel to the fluid is possible.

Preferably, the cooling element 1 comprises at least one first metal layer 11, at least one second metal layer 12 and/or at least one third metal layer 13. To form the cooling channel, the at least one first metal layer 11, the at least one second metal layer 12 and/or the at least one third metal layer 13 are structured by at least one recess 21, 22 in such a way that they form the cooling channel by stacking one on top of the other or by superimposing one on top of the other along the stacking direction S.

In particular, it is provided that the at least one first metal layer 11, the at least one second metal layer 12 and/or the at least one third metal layer 13 are each differently structured or provided with differently extending recesses 21, 22. In particular, it is provided that the at least one first metal layer 11, the at least one second metal layer 12 and/or the at least one third metal layer 13 form at least one first portion 21 in the at least one recess 21, 22 comprising the web-like elements 7 extending in particular in a main extension plane HSE perpendicular to the stacking direction S. In addition to the first part 21 of the at least one recess 21, 22 in the at least one first metal layer 11, it is preferably provided that a second part 22 of the at least one recess 21, 22 in the at least one first metal layer 11 is provided for feeding or discharging the cooling fluid into or out of the first part 21 or forms part of the feed area and/or discharge area.

The cooling element 1 is preferably bounded in the stacking direction S by an upper covering layer 15 and a lower covering layer 14, the at least one first metal layer 11, the at least one second metal layer 12 and/or the at least one third metal layer 13 being arranged between the lower covering layer 14 and the upper covering layer 15, as seen in the stacking direction S. In particular, the formation comprising the at least one first metal layer 11, the at least one second metal layer 12 and/or the at least one third metal layer 13 is sandwiched between the upper covering layer 15 and the lower covering layer 14. In addition to the at least one recess 21, 22, which is composed of the first portion 21 and the second portion 22, it is preferably provided that the cooling element 1 and/or the at least one first metal layer 11 comprises a further recess 24, which is not part of the cooling channel with the fin structure 25. Furthermore, it is preferably provided that a terminal area 30 is provided at the upper covering layer 15 and/or the lower covering layer 14. In particular, the electrical or electronic component is connected to this terminal area 30, in particular as seen in the stacking direction S, above or below the fin structure 25, which preferably extends in a direction perpendicular to the stacking direction S. In other words, the fin structure 25, in particular its web-like elements 7, extends below the terminal area 30 and preferably parallel thereto. By appropriately arranging the fin structure 25 comprising the web-like elements 7 above or below the terminal area 30, the electrical or electronic component can be effectively cooled by means of the fin structure 25.

Figure 2:
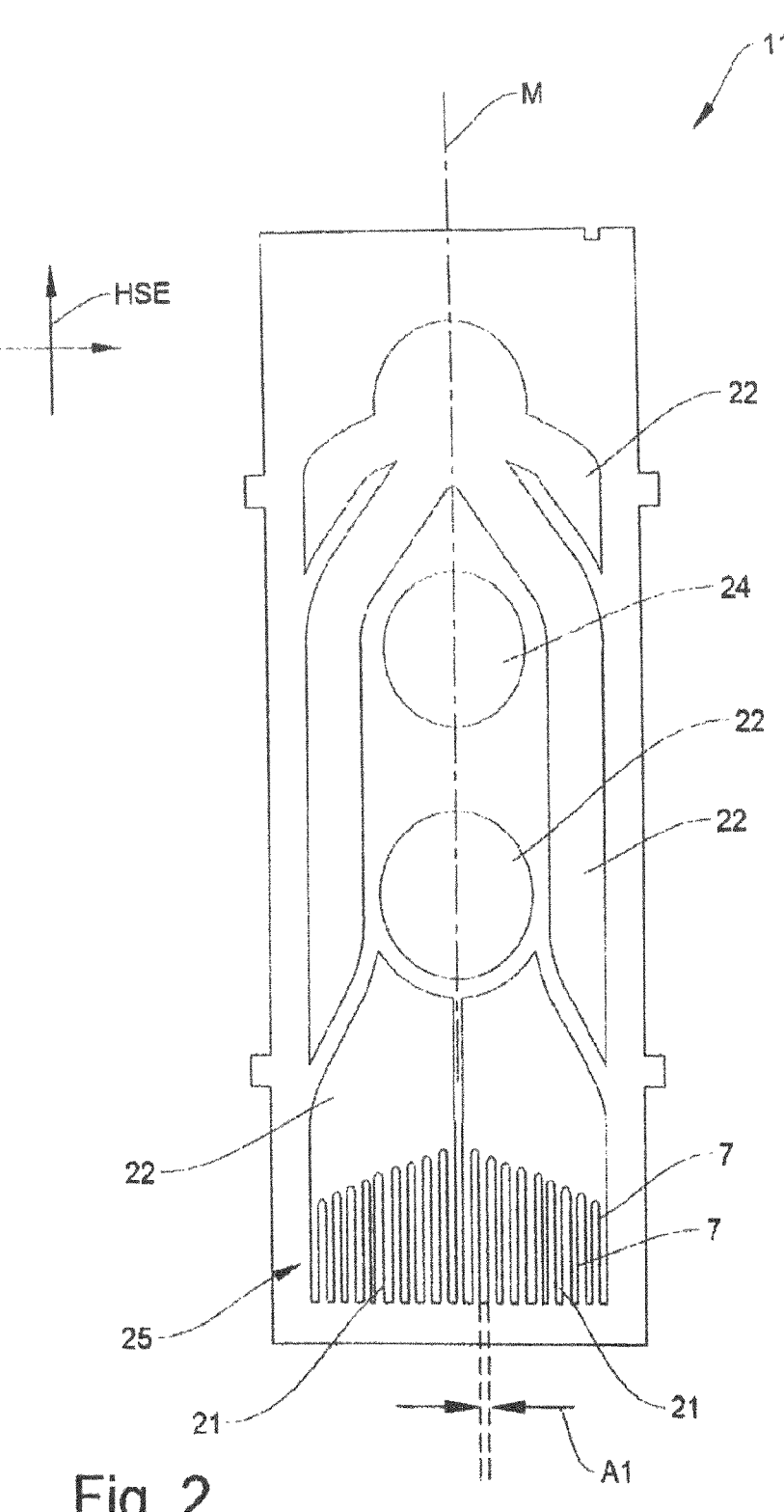
FIG. 2: schematic representation of a first metal layer for a cooling element of FIG. 1, FIG. 3: schematic representation of a cooling element according to a second exemplary embodiment of the present invention.

FIG. 2 shows a schematic representation of at least one first metal layer 11, for example as shown in FIG. 1. In the embodiment shown, the fin structure 25 is formed from web-like elements 7 which, viewed in the main extension plane HSE, extend to different extents. In particular, a length of the web-like elements 7 increases towards a central axis M of the at least one first metal layer 11. In this way, it is advantageously possible to maximize the cooling effect as much as possible, in particular in the central region of the terminal area 30. Furthermore, it is conceivable that the web-like elements extend parallel and/or obliquely to the central axis M. Preferably, the shape of the web-like elements 7, in particular their length and/or inclination relative to the central axis M along the main extension plane HSE, is determined or specified by the corresponding requirement profile for cooling the corresponding electrical or electronic component.

In order to obtain the smallest possible distance A1 between two adjacent web-like elements 7, it is preferably provided that the first portion 21 of the at least one recess 21, 22 in the at least one first metal layer 11 is made by an erosion, in particular spark erosion, and/or an etching. In particular, this involves manufacturing by means of wire erosion.

It is further provided that a second portion 22 of the at least one recess 21, 22 is performed by etching. Preferably, the etching is carried out in particular in large-area regions of the second portion 22 of the recess 21, 22, that is to say in the subsequent supply and/or discharge regions formed for supplying and discharging the cooling fluid. In contrast, it is particularly envisaged that the eroding is provided for the finely structured formation of the recess 21, 22, i.e. the first portion 21 of the recess 21, 22. It has been found that, by this means, comparatively very small distances between the web-like elements 7 can be produced without having to rely on several first metal layers 11 with etched first portions 21 of the at least one recess 21, 22, which would have to be stacked one on top of the other in order to realize the smallest possible distance between two web-like elements 7. Preferably, the distance A1 between opposing side walls between two web-like elements 7 is less than 0.4 mm, preferably less than 0.3 mm and particularly preferably less than 0.2 mm. In this way, as many web-like elements 7 as possible can be integrated into the fin structure 25. Accordingly, it is possible to increase the cooling effect, since the contact area between the cooling fluid and the conversion of the cooling channel can be increased in a corresponding manner.

Preferably, the at least one first metal layer 11, the at least one second metal layer 12, the at least one third metal layer 13, the top covering layer 15 and/or the lower covering layer 14 have a thickness measured in the stacking direction S of between 0.2 and 0.7 mm, preferably between 0.35 and 0.6 mm and particularly preferably between 0.3 and 0.4 mm. Preferably, the at least one first metal layer 11, the at least one second metal layer 12 and/or the at least one third metal layer 13 each form the same thickness. Furthermore, it is preferably provided that the at least one first metal layer 11, the at least one second metal layer 12 and/or the at least one third metal layer 13 are formed into an integral cooling channel in the course of a sintering process, in that the microstructures of the at least one first metal layer 11, the at least one second metal layer 12 and/or the at least one third metal layer 13 merge or fuse into one another by means of a corresponding temperature treatment. It is further provided that also the upper covering layer 15 and/or the lower covering layer 14 each comprise at least one recess 21, 22 and/or a further recess 24, wherein the upper covering layer 15 and/or the lower covering layer 14 are preferably free of web-like elements 7 or components of a subsequent fin structure 25. The further recesses 24 preferably serve for fastening or fixing the cooling element 1.

Figure 3:
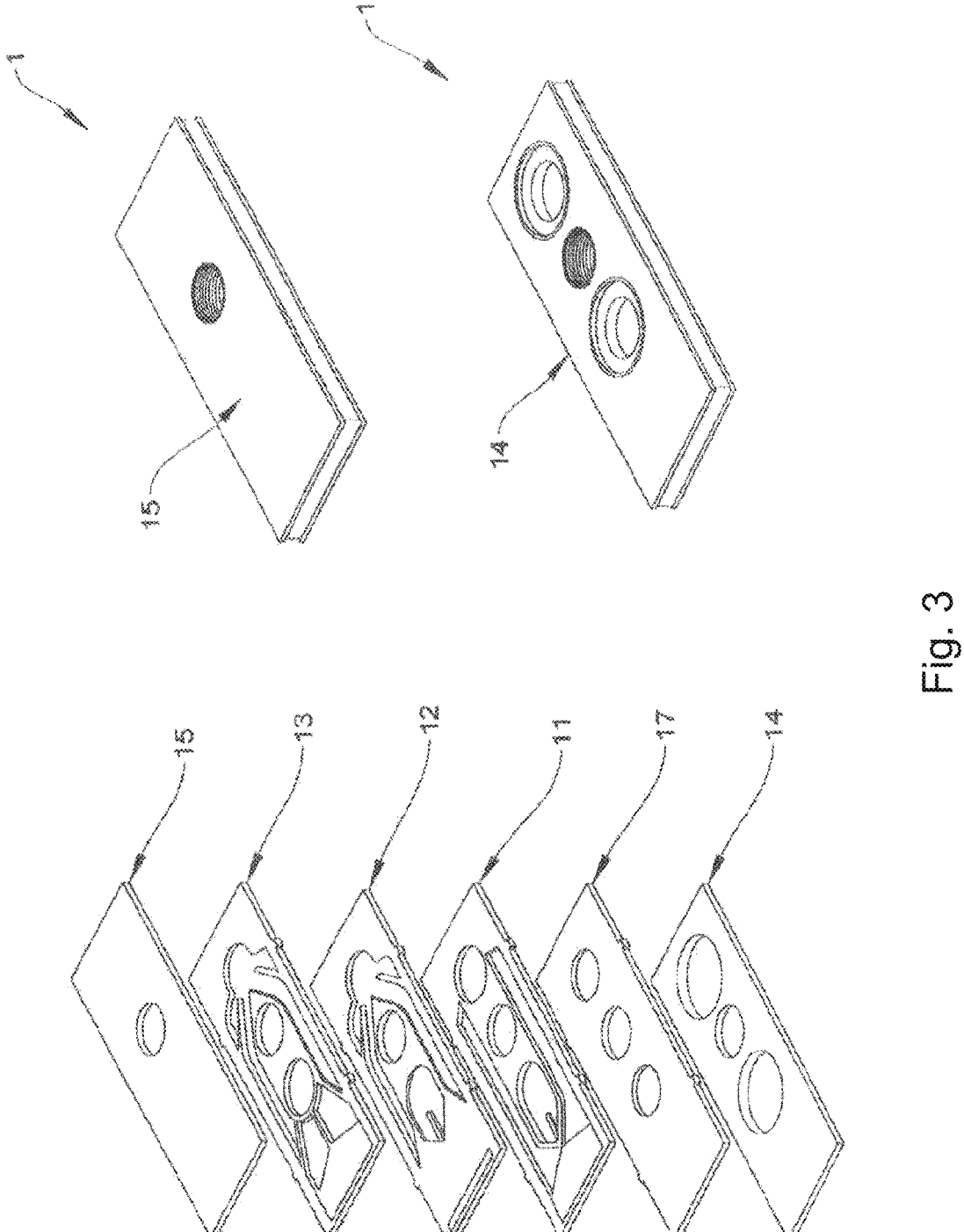

FIG. 3 shows a cooling element 1 according to a second preferred embodiment. In this case, the cooling element 1 essentially corresponds to that cooling element 1 from FIG. 1 and differs essentially only in that the lower covering layer 14 and/or the upper covering layer 15 is formed as a metal-ceramic composite. In particular, it is provided that the upper covering layer 15 and/or the lower covering layer 14 each comprise a ceramic layer, preferably of aluminium nitride, which is covered, for example, on both sides with a metal layer, preferably a copper layer. For example, it is a ceramic layer of aluminium nitride, the thickness of which, measured in the stacking direction S, assumes a value of between 0.1 mm and 0.5 mm, preferably between 0.2 mm and 0.4 mm, and particularly preferably substantially 0.38 mm, while the external metal layers which cover the ceramic layer in each case have a thickness of between 0.05 and 0.4 mm, preferably between 0.1 and 0.3 mm, and particularly preferably between 0.15 and 0.25 mm.

In particular, it is provided that the metal layers formed on opposite sides of the ceramic layer have different thicknesses. For example, the one metal layer has a copper thickness of 0.2 mm, while the opposite copper layer has a thickness of 0.12 mm, which is realized in particular by a diamond grinding after the joining process of the metal layer to the copper layer. Preferably, the upper covering layer 15 and/or the lower covering layer 14 is a metal-ceramic composite produced by means of a DCB process.

Furthermore, it is preferably provided that the cooling element 1 of FIG. 3 has a sealing element support layer 17 in which or with which, for example, O-rings can be fixed in order to ensure a corresponding seal in the connection region for the feed region and the discharge region of the cooling element 1. Preferably, the sealing element support layer 17 is a metal layer with corresponding recesses 21, 22 or further recesses 24, wherein the sealing element support layer 17 can have a thickness, measured in the stacking direction, of between 0.1 and 0.4 mm, preferably between 0.1 and 0.4 mm and particularly preferably between 0.2 and 0.3 mm.

In addition, the embodiment of FIG. 3 differs from that of FIG. 1 in that the cooling element 1 is closed at its upper covering layer 15 and an inlet opening for supplying the cooling fluid and an outlet opening for discharging the cooling fluid are formed exclusively at the lower covering layer 14, so that the cooling fluid which is introduced into the cooling element 1 via the lower covering layer 14 passes through the latter along the stacking direction S and is deflected in the at least one third metal layer 13, and then leaves the cooling element 1 again in the opposite direction. The upper covering layer 15 and the lower covering layer 14 made of a metal-ceramic composite prove to be particularly advantageous for such applications in which the cooling element 1 has to be electrically insulated from the component which is mounted on the cooling element 1 or attached to the cooling element 1.

Figure 4:
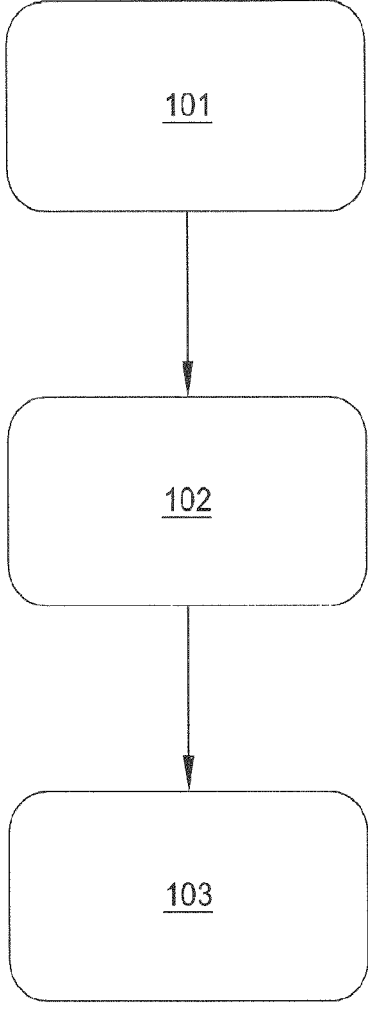
FIG. 4: Schematic representation of a process for producing a cooling element according to an exemplary embodiment of the present invention.

FIG. 4 shows a schematic representation of a method for manufacturing a cooling element 1 according to an exemplary embodiment of the present invention. In particular, it is provided here that in a preparation step the at least one first metal layer 11, the at least one second metal layer 12 and/or the at least one third metal layer 13 are provided. In particular, the at least one first metal layer 11, the at least one second metal layer 12 and/or the at least one third metal layer 13 are provided as plate-shaped and/or unstructured metal sheets or foils.

The provided at least one first metal layer 11, the at least one second metal layer 12 and/or the at least one third metal layer 13 are preferably first oxidized, in particular by being or being conveyed through a corresponding installation or chemical wet cell, preferably horizontally. By this oxidizing 101 the unstructured at least one first metal layer 11, the at least one second metal layer 12 and/or the at least one third metal layer 13 is or are provided with an oxidized surface, in particular over the entire outer surface of the at least one first metal layer 11, the at least one second metal layer 12 and/or the at least one third metal layer 13.

Subsequently, the at least one first metal layer 11, the at least one second metal layer 12 and/or the at least one third metal layer 13 are structured, for example by being etched and/or eroded, to form a recess 21, 22 and/or a further recess 24. By determining the sequence in such a way that a structuring 102 takes place only after the oxidizing 101, it is advantageously possible to realize etching flanks on the inner sides of the recesses 21, 22 in the at least one first metal layer 11, the at least one second metal layer 12 and/or the at least one third metal layer 13 which are free of an oxidized surface. This proves to be advantageous because it can be avoided that, during subsequent joining 103 of the at least one first metal layer 11 to the at least one second metal layer 12, a melt produced during the joining process does not reduce the extent of the recess 21, 22 or even leads to a blockage here. This has in particular a positive effect for such cooling elements 1 whose cooling channels are comparatively narrow or thin.

After the structuring 102, the at least one first metal layer 11 and the at least one second metal layer 12 are stacked on top of each other along a stacking direction S and then bonded together in a joining process. Preferably, for this purpose, the ensemble of the at least one first metal layer 11 and the at least one second metal layer 12 is heated to a temperature between 850° C. and 1080° C., whereby a joining of the at least one first metal layer 11 and the at least one second metal layer 12 is realized forming a one-piece or monolithic cooling element 1 with at least one cooling channel.

FIGS. 5a to 5d show various embodiments of the at least one first metal layer 11, the at least one second metal layer 12 and/or the at least one third metal layer 13 according to a third, fourth, fifth and sixth embodiment of the present invention. In particular, the at least one first metal layer 11, the at least one second metal layer 12 and/or the at least one third metal layer 13 are used to form, by stacking and subsequent joining, cooling elements 1 intended for cooling power electronics. In this process, the at least one first metal layer 11 and/or the at least one second metal layer 12, in particular their recesses 21, 22, are offset with respect to one another or laterally offset with respect to one another or are rotated with respect to one another about an axis extending perpendicularly to the main extension plane HSE and are then stacked one on top of the other. Then, the stacked layers are connected to each other by the ground. Preferably, the method described above is used for manufacturing the cooling element. As a result, meander-shaped or loop-shaped progressions are formed in manufactured cooling elements 1, which form the largest possible contact surface between the metal and the cooling fluid. Preferably, it is provided that the formed cooling channels have a substantially U-shaped course, wherein the U-shaped course guides the cooling fluid to the side to be cooled, i.e. to the component side or connection surface, and then guides it away again. In other words, in contrast to the embodiments of FIGS. 1 and 3, the cooling fluid does not run substantially parallel to the outer side of the cooling element 1 to be cooled, but substantially or for the most part (i.e. with the exception of the reverse section in the loop-shaped section of the cooling channel) vertically or obliquely (i.e. inclined to a direction running perpendicular to the main extension plane HSE) to the outer side of the cooling element 1 to be cooled. By means of a plurality of such loop-shaped cooling channels, an effective and, if necessary, locally targeted cooling can then be realized.

Figures 5A, 5B, 5C, 5D:
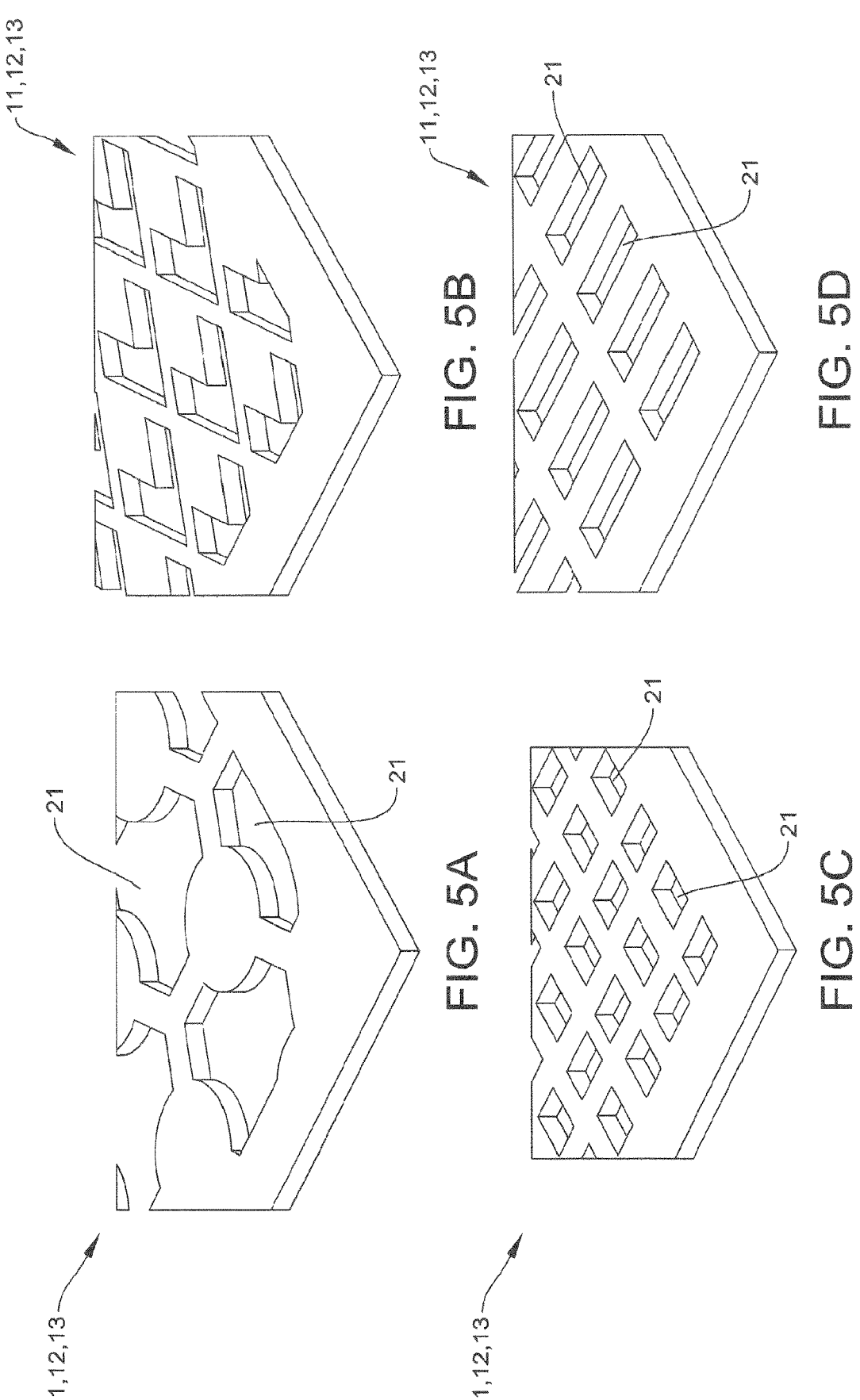
FIGS. 5a to 5d: schematic representations of a first metal layer and/or a second metal layer for a cooling element according to a third, fourth, fifth and sixth embodiment of the present invention.

The recesses 21, 22 in the at least one first metal layer 11, the at least one second metal layer 12 and/or the at least one third metal layer 13, in particular in FIGS. 5a to 5d, have a polygonal shape in which, for example, the corners may be rounded. The shape shown in FIG. 5a has a substantially hexagonal basic shape, with a bulge formed at every second corner of the basic shape of the recess 21, 22. In the assembled state, the protrusions of the individual metal layers stacked one on top of the other form a post which extends in particular over more than half, preferably more than ⅔ and particularly preferably over more than ¾ of the thickness of the cooling element 1 dimensioned perpendicularly to the main extension plane HSE. The recess 21, 22 shown in FIG. 5b has a substantially V-shaped contour, the recesses 21, 22 of two adjacent rows of recesses 21, 22 being laterally offset from each other. In FIG. 5c, rectangular recesses 21, 22 are provided extending in a checkerboard-like pattern over the at least one first metal layer 11, the at least one second metal layer 12 and/or the at least one third metal layer 13.

In FIG. 5d, the rectangular recesses are oriented differently, in particular in such a way that their longitudinal direction is perpendicular to each other. In other words, the rectangular recesses are rotated 90° with respect to each other.

| Reference Numeral List: | |
|---|---|
| 1 | cooling element |
| 7 | web-like element |
| 11 | first metal layer |
| 12 | second metal layer |
| 13 | third metal layer |
| 14 | lower covering layer |
| 15 | upper covering layer |
| 17 | sealing element support layer |
| 21 | first portion of the recess |
| 22 | second portion of the recess |
| 24 | further recess |
| 25 | fin structure |
| 30 | terminal area |
| 101 | oxidizing |
| 102 | structuring |

-continued

| Reference Numeral List: | |
|---|---|
| 103 | joining |
| A1 | distance |
| S | stacking direction |
| M | middle axis |
| HSE | main extension level |

The invention claimed is:

1. A method of manufacturing a cooling element (1), the method comprising: providing at least one first metal layer (11) and at least one second metal layer (12), oxidizing (101) the at least one first metal layer (11) and/or the at least one second metal layer (12), structuring (102) the at least one first metal layer (11) and/or the at least one second metal layer (12) to form at least one recess (21, 22), and performing a direct metal bonding to join the at least one first metal layer (11) and the at least one second metal layer (12) to form the cooling element (1), wherein, in a joined state, at least a partial section of a cooling channel is formed in the cooling element (1) by the recess (21, 22) in the at least one first metal layer (11) and/or the at least one second metal layer (12) and wherein, while performing the direct metal bonding, an inner side of the recess (21, 22) is provided completely free of an oxidized surface.

2. The method according to claim 1, wherein the oxidizing (101) is performed temporally prior to the structuring (102).

3. The method according to claim 1, wherein the structuring (102) of the at least one first metal layer (11) and/or the at least one second metal layer (12) comprises etching, lasering, laser assisted structuring and/or eroding.

4. The method according to claim 1, wherein prior to the joining (103) a region of an upper side and/or a lower side of the at least one first metal layer (11) and/or the at least one second metal layer (12) adjacent to the recess (21, 22) is provided freed from an oxidized surface.

5. The method according to claim 1, wherein in addition to the recess (21, 22) in the at least one first metal layer (21) and/or the at least one second metal layer (22) a region of reduced thickness is realized.

6. The method according to claim 1, wherein the oxidizing (101) is carried out thermally and/or wet-chemically.

7. The method according to claim 1, wherein the manufactured cooling element (1) has an upper covering layer (15) and/or a lower covering layer (14), wherein, viewed in the stacking direction(S), the at least one first metal layer (11) and/or the at least one second metal layer (12) and/or an at least one third metal layer (13) is arranged below the upper covering layer (15) and/or above the lower covering layer (14), the upper covering layer (15) and/or the lower covering layer (14) having a terminal area (30) for connecting a component to be cooled.

8. The method according to claim 7, wherein the component to be cooled is a laser diode.

9. The method according to claim 1, wherein the recess (21, 22) has an extension, a width, in a direction parallel to a main extension plane (HSE) up to 0.8 mm.

10. The method according to claim 9, wherein, the width is up to 0.4 mm.

11. The method according to claim 1, wherein the direct metal bonding is at a temperature between 850° C. and 1080° C.

12. The method according to claim 1, wherein the joining is by bonding.

13. The method according to claim 1, wherein prior to the joining (103), an inner side of the recess (21, 22) is provided at least in sections completely free of an oxidized surface.

14. The method according to claim 1, wherein the direct metal bonding comprises direct copper bonding (DCB) or direct aluminum bonding (DAB).

15. A method of manufacturing a microcooling element (1), the method comprising:

providing at least one first metal layer (11) and at least one second metal layer (12), oxidizing (101) the at least one first metal layer (11) and/or the at least one second metal layer (12), after oxidizing, structuring (102) the at least one first metal layer (11) and/or the at least one second metal layer (12) to form at least one recess (21, 22), and performing a direct metal bonding at a temperature between 850° C. and 1080° C. to join the at least one first metal layer (11) and the at least one second metal layer (12) to form the cooling element (1), wherein, in a bonded state, at least a partial section of a cooling channel is formed in the cooling element (1) by the recess (21, 22) in the at least one first metal layer (11) and/or the at least one second metal layer (12), and wherein, while performing the direct metal bonding, an inner side of the recess (21, 22) is provided completely free of an oxidized surface.

16. The method of claim 15, wherein prior to the joining (103) a region of an upper side and/or a lower side of the at least one first metal layer (11) and/or the at least one second metal layer (12) adjacent to the recess (21, 22) is provided freed from an oxidized surface.

17. The method according to claim 15, wherein in addition to the recess (21, 22) in the at least one first metal layer (21) and/or the at least one second metal layer (22) a region of reduced thickness is realized.

18. Method of claim 15, wherein the recess (21, 22) has an extension, a width, in a direction parallel to a main extension plane (HSE) up to 0.8 mm.

* * * * *